United States Patent [19]

Gehri et al.

[11] Patent Number: 5,438,686

[45] Date of Patent: Aug. 1, 1995

[54] AMPLITUDE-MODULATED BROADCAST TRANSMITTER FOR VARIOUS TYPES OF MODULATION, IN PARTICULAR DSB, SSB AND ISB

[75] Inventors: Patrick Gehri, Birr; Nenad Tomljenovic, Nussbaumen, both of Switzerland

[73] Assignee: Thomcast AG, Turgi, Switzerland

[21] Appl. No.: 25,657

[22] Filed: Mar. 3, 1993

[30] Foreign Application Priority Data

Mar. 27, 1992 [DE] Germany .................. 42 10 069.0

[51] Int. Cl.$^6$ .............................................. H04B 1/04
[52] U.S. Cl. ...................................... 455/102; 455/47; 455/108; 455/109; 332/151
[58] Field of Search ............. 455/93, 102, 103, 104, 455/108, 109, 110, 47; 332/103, 151, 170, 167, 149, 144, 145; 381/15, 16

[56] References Cited

U.S. PATENT DOCUMENTS

| | | | |
|---|---|---|---|
| 3,217,256 | 11/1965 | Palatinus | 455/109 |
| 4,955,072 | 9/1990 | Tomljenovic | 455/108 |
| 5,020,154 | 5/1991 | Zierhut | 455/102 |

Primary Examiner—Edward F. Urban
Assistant Examiner—Nguyen Vo
Attorney, Agent, or Firm—Oblon, Spivak, McClelland, Maier & Neustadt

[57] ABSTRACT

In an amplitude-modulated broadcast transmitter for various types of modulation, particularly DSB (double sideband), SSB (single sideband) and ISB (independent sideband), of at least one AF signal to be transmitted, the sum and the difference is formed from the two input channels (7a, 7b). Either the sum or the difference is subjected to a Hilbert transformation in a Hilbert transformer (12). From these signals, an amplitude signal is formed in an amplitude processor (22) and a phase signal is formed in a cyclic sampler (21) and a phase conditioner (23). The amplitude signal is used for anode modulating the transmitting tube (5) and the phase signal is used for grid modulating the transmitting tube. The amplitude-modulated broadcast transmitter for various types of modulation has the advantage that the three types of modulation ISB, DSB and SSB can be set by allocating the AF signals to be transmitted to the two input channels (7a, 7b).

12 Claims, 4 Drawing Sheets

AMPLITUDE-MODULATED BROADCAST TRANSMITTER FOR VARIOUS TYPES OF MODULATION, IN PARTICULAR DSB, SSB AND ISB

BACKGROUND OF THE INVENTION

1. Field of the Invention

The invention relates to the field of broadcast transmitting technology. In particular, it relates to an amplitude-modulated broadcast transmitter for various types of modulation, particularly DSB (double sideband), SSB (single sideband) and ISB (independent sideband).

A method and a corresponding device for generating an ISB transmitting signal are known from U.S. Pat. No. 4,955,072.

A method and a corresponding device for generating an SSB transmitting signal are known from EP 0,193,655 A1.

Various methods and corresponding devices for generating a DSB transmitting signal are described, for example, in the book "Taschenbuch der Hochfrequenztechnik" (Pocket book of radio-frequency engineering) (H. Meinke and F. W. Gundlach, Springer-Verlag Berlin/Heidelberg/New York 1968).

2. Discussion of Background

In broadcast transmitting technology working with amplitude modulation (AM), transmitters are used in which, of the two sidebands produced by the modulation, either both (DSB=double sideband) or only one (SSB=single sideband) are transmitted. In addition, there is also the variant that the two sidebands carry different information items independently of one another (ISB=independent sideband). In the amplitude-modulated broadcast transmitters according to the prior art, DSB, SSB and ISB transmitters having different modulators in each case are used for the different types of modulation.

A method for generating an amplitude-modulated ISB transmitting signal and a device for carrying out the method is proposed in U.S. Pat. No. 4,955,072. It is based on the single-sideband modulation method disclosed in EP 0,193,655 A1, and the corresponding single sideband modulator.

An SSB signal or an ISB signal is no longer purely amplitude modulated but additionally also phase modulated. A device must therefore be provided for the required phase modulation. The two independent AF signals are split into their orthogonal components in the said ISB method. From these orthogonal components and a carrier amplitude, component sums are formed in such a manner that a signal is produced which contains the information from one AF signal in the lower sideband and that from the second AF signal in the upper sideband. This signal is then supplied to an amplitude processor or a cyclic sampler. The amplitude processor supplies an amplitude signal which, after suitable conversion, can be used for the anode modulation of the transmitting tube. From the samples of the sampler, a phase signal is obtained by clipping or null detection. After suitable frequency conversion, this phase signal is used for the grid modulation of the transmitting tube. It thus modulates the carrier oscillation of the transmitting signal.

In the said SSB method and the corresponding device, a phase-independent amplitude signal and an amplitude-independent phase signal is generated in similar manner from an AF signal.

However, it is common to these various methods and devices that they can in each case only be used for one type of modulation.

SUMMARY OF THE INVENTION

Accordingly, one object of the invention is to provide a novel broadcast transmitter which can be used for all three types of modulation (DSB, SSB and ISB) using the same modulator.

In the amplitude-modulated broadcast transmitter for various types of modulation, particularly DSB (double sideband), SSB (single sideband) and ISB (independent sideband) according to the invention, which comprises a) a signal input for at least one AF signal to be transmitted;

b) a signal conditioner having at least one input channel and two outputs, the input of the signal conditioner being connected to the signal input, and at the first output of the signal conditioner an amplitude signal being output and at the second output a phase signal being output;

c) a direct-voltage-coupled power amplifier, arranged after the first output, for amplifying the amplitude signal;

d) a phase conditioner, arranged after the second output, for processing the phase signal; and e) an output stage with a transmitting tube which exhibits an anode and at least one control grid, the output of the power amplifier being connected to the anode and the output of the phase conditioner being connected to the at least one control grid;

this object is achieved by the fact that f) the signal conditioner has two input channels and comprises aa) an adder and a subtractor which form the sum and the difference of the input channels;

bb) a Hilbert transformer, the input of which is connected either to the output of the adder or of the subtractor and which subjects either the sum or the difference to a Hilbert transformation;

cc) two inverters the inputs of which are connected to the outputs of either the adder or of the subtractor and of the Hilbert transformer and which inverters invert the sign of the signals present at their inputs;

dd) a cyclic sampler which cyclically samples the outputs of the inverters and either of the adder or of the subtractor and of the Hilbert transformer in a particular sequence;

ee) a phase conditioner, the input of which is connected to the output of the cyclic sampler and the output of which is connected to the phase output, and which phase conditioner generates a phase signal from the samples of the cyclic sampler;

ff) an amplitude processor which is connected with its two inputs to the output of either the adder or of the subtractor and of the Hilbert transformer and in each case squares the input signals, adds them and takes the square root of the result and delivers this signal to its output which is connected to the amplitude output; and g) the type of modulation is determined by allocating the AF signals to be transmitted in a particular manner to the two input channels.

The broadcast transmitter according to the invention has the advantage that it can be used for all three types of modulation DSB, SSB and ISB.

According to a preferred embodiment, the operating modes are set by a) connecting two mutually independent AF signals to the two input channels for ISB;

b) connecting two equal AF signals to the two input channels for DSB; and c) connecting an AF signal to only one input channel for SSB, whilst the other input channel is connected to ground.

The totality of the dependent claims results in further advantageous embodiments.

The core of the invention consists in that in the broadcast transmitter according to the invention, all three types of modulation DSB, SSB and ISB can be set by either connecting together the two AF signal inputs for DSB or feeding in the same signal, applying a signal to only one input for SSB whilst the other one is connected to ground, and applying two mutually independent signals to the two AF signal inputs for ISB. The broadcast transmitter according to the invention can thus be used universally and the operating mode can be set by the way in which the AF signals are allocated to the input channels.

BRIEF DESCRIPTION OF THE DRAWINGS

A more complete appreciation of the invention and many attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
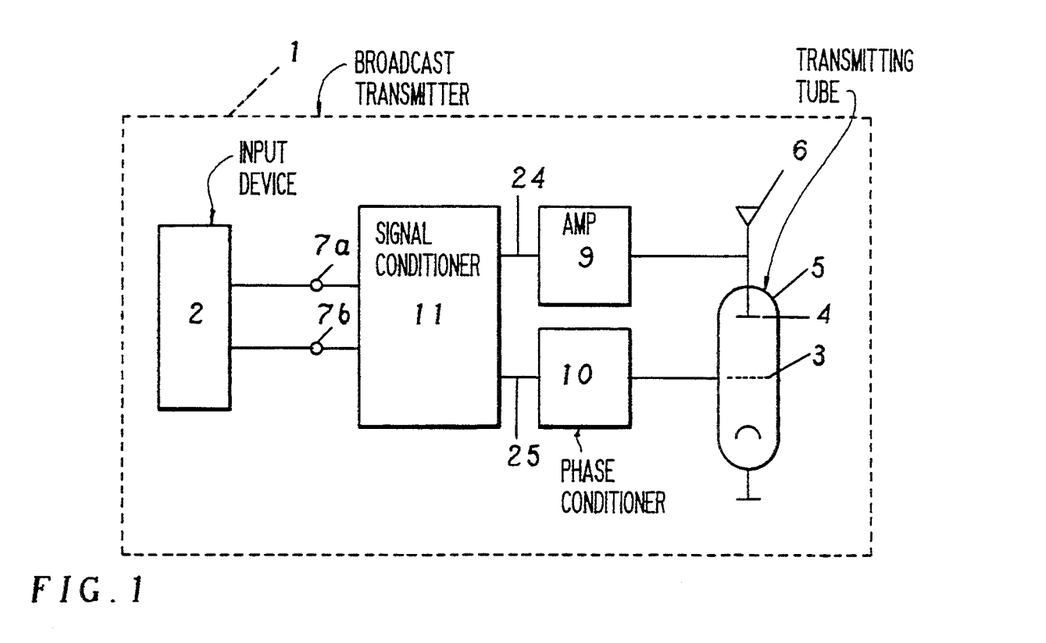
FIG. 1 shows a block diagram of a broadcast transmitter according to the invention.

Referring now to the drawings, wherein like reference numerals designate identical or corresponding parts throughout the several views, FIG. 1 shows the block diagram of an amplitude-modulated broadcast transmitter (1) according to the invention for various types of modulation, particularly DSB, SSB and ISB.

The broadcast transmitter (1) comprises a signal input (2), a signal conditioner (11), a direct-voltage-coupled power amplifier (9), a phase conditioner (10) and a transmitting tube (5). The signal input (2) is designed for at least one signal to be transmitted and is connected to the two input channels (7a, 7b) of the signal conditioner (11). In the signal conditioner (11), an amplitude signal and a phase signal, which are available at the amplitude and, respectively, phase output (24, 25) of the signal conditioner (11), are generated as determined by the AF signals (AF1, AF2) which are present at the input channels (7a, 7b).

The amplitude signal is amplified in a direct-voltage-coupled power amplifier (9) arranged after the amplitude output (24), and applied as anode-modulating signal to the anode (4) of the transmitting tube (5). The direct-voltage-coupled power amplifier (9) preferably comprises a pulse strip modulation (PSM) amplifier. However, other types of amplification, for example class-B push-pull amplifiers, are also conceivable.

The phase signal is brought into the form required for grid modulation in a phase conditioner (10) arranged after the phase output (25). The output of the phase conditioner (10) is connected to the at least one control grid (3) of the transmitting tube (5).

The phase conditioner (10) essentially comprises a frequency converter which steps up the phase signal to the required carrier frequency.

The operation of the signal conditioner (11) belonging to the broadcast transmitter according to the invention will be explained with reference to FIGS. 2, 3a–3c, 5a and 5b.

Figure 3A:
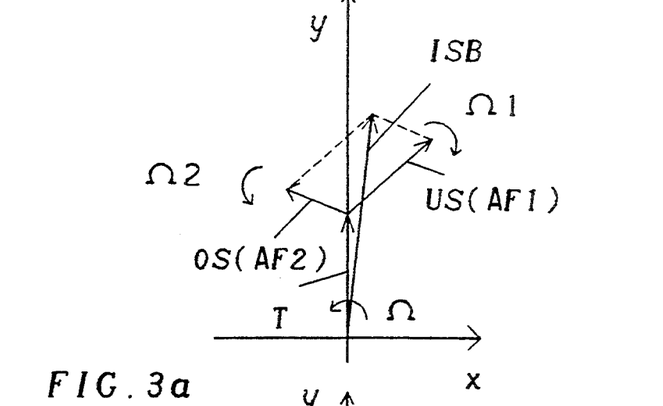
FIG. 3a shows a vector diagram of an ISB signal.

FIG. 3a shows the vector diagram of an ISB signal. It can be clearly seen how the resultant ISB vector is composed of a carrier T and two AF signals represented as the vectors AF1 and AF2. The vectors AF1 and AF2 rotate at the frequency $\Omega 1$ and, respectively, $\Omega 2$. In the frequency domain, AF1 represents the upper sideband and AF2 the lower sideband. Comparing FIGS. 3b and 3c with FIG. 3a, it becomes clear that an ISB signal is the most general form of amplitude modulated signal with two sidebands. This is because, in a DSB signal, the two signals AF1 and AF2 are equal and in a SSB signal there is only one signal. Thus, the invention can be explained with reference to an ISB signal, without restricting the general applicability, and the restriction to the special cases DSB and SSB can be made at the conclusion.

As already explained, an ISB signal consists of a carrier T which, represented as a vector, rotates in the plane at the angle of frequency $\Omega$, and the sum of two vectors AF1 and AF2 which rotate in opposite directions to one another ($\Omega 1$ and, respectively, $\Omega 2$). AF1 thus represents the lower sideband and AF2 the upper. The oppositely directed rotation is achieved by one vector, AF1 in the present case, being phase shifted by −90°. The −90° phase shift is achieved by shifting AF1 for the lower sideband by −180° or 180° during the summation, which corresponds to an inversion of the sign (subtraction). The sum corresponding to the upper sideband is then shifted by 90° compared with the difference obtained. At the end, a total shift by −90° is thus obtained. The 90° phase shift of the sum compared with the difference is preferably carried out in a Hilbert transformer. The important factor in this case is not the absolute phase shift between the sum and the difference but the relative phase shift. Since the Hilbert transformation is a linear transformation, it can also be carried out before the sum or difference is formed.

After the operations of summation, subtraction and Hilbert transformation mentioned above, the vector ISB is thus available, to come back to the vector diagram representation. It must now only be rotated in such a manner that it carries the information of the first AF signal (AF1) in the lower sideband and that of the second AF signal (AF2) in the upper one. A vector is generally completely defined either by its components or by amount and phase. It is thus sufficient to transmit amplitude and phase for transmitting the complete information.

Figure 2:
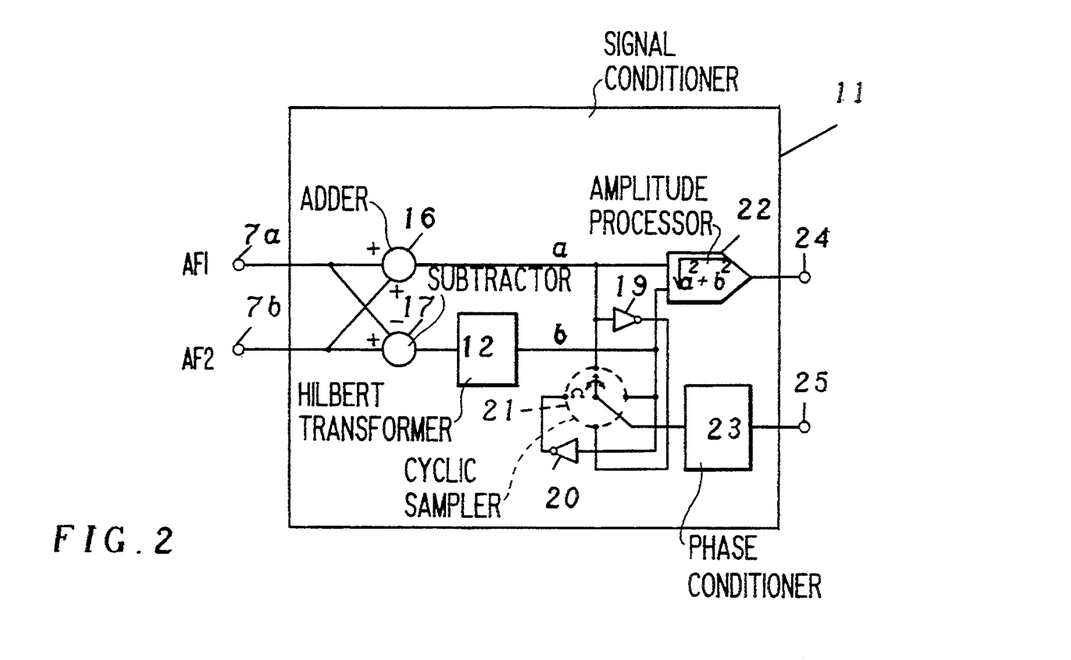
FIG. 2 shows a block diagram of a signal conditioner according to the invention.

The amount can be calculated in a simple manner by individually squaring the orthogonal components and summing these squares and then taking the square root. The orthogonal components here correspond to the output of the Hilbert transformer (12) a and the output b of either of the adder or of the subtractor. This is because signals a and b are orthogonal to one another (−90° phase shift). This provides the amplitude signal.

To determine the phase, the following approach is taken:

To obtain a complete ISB signal, the vector ISB must be additionally rotated at the angle of frequency $\Omega$. This is achieved by cyclically sampling the vector in a prescribed sequence. A vector ISB rotating counter clockwise at an angle of frequency $\Omega$ can be simulated by cyclically sampling its components a or, respectively, b, in the order a, -b, -a, b, a, -b . . . A clockwise rotation results in a sampling in the order a, b, -a, -b, a, b, . . . A sequence of the type a, b, -a, -b, a, b, . . . can also be represented as the sum of the sequences a, 0, -a, 0, a, 0 . . . and 0, b, 0, -b, 0, b . . .

Figure 5A:
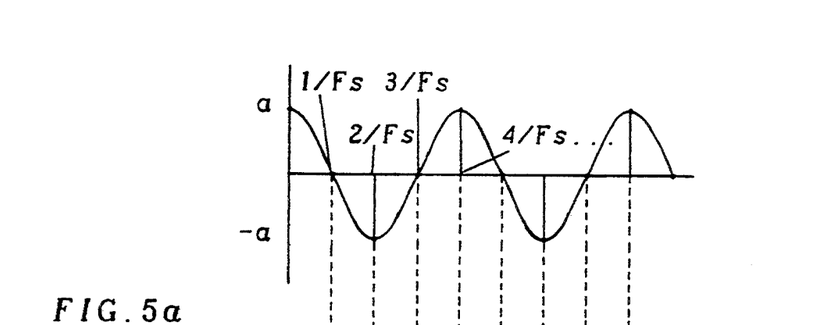
FIG. 5a shows the sampling of a cosinusoidal signal.
Figure 5B:
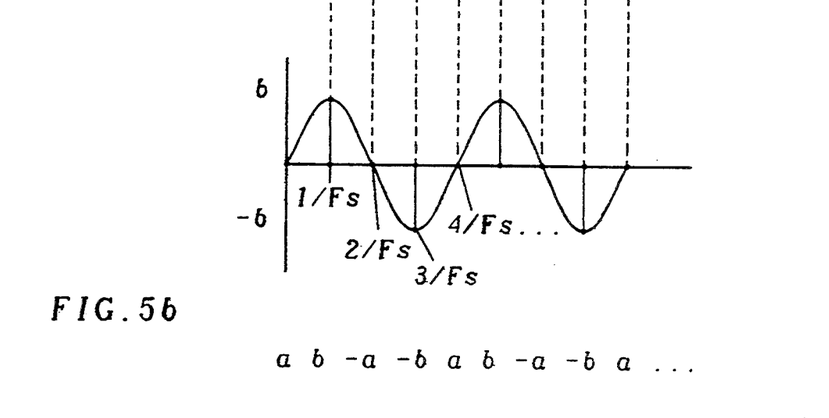
FIG. 5b shows the sampling of a sinusoidal signal.

As is shown in FIGS. 5a and 5b, a sequence of the type a, 0, -a, 0, a, 0 . . . and 0, b, 0, -b, 0, b corresponds to sampling a cosinusoidal signal with the frequency Fs/4 and the amplitude a, or to the sampling of a sinusoidal signal having the same frequency and the amplitude b. The cyclic sampling of the sum and of the difference signal thus corresponds to a multiplication by a cos or, respectively, a sin signal with the frequency $\Omega = Fs/4$. Since the vector ISB is composed of the carrier amplitude T and the rotating vectors AF1 and AF2, the phase of the signal produced changes to the same extent as the two vectors AF1 and AF2.

The phase information must now be obtained in a particular manner. The aim is to obtain a harmonic phase signal of the form $\cos(\Omega t + \Phi(t))$.

In the normal case, the sampling frequency $\Omega$ will be much greater than the cut-off frequencies of the AF signals AF1 and AF2. This means that the zero transitions of the abovementioned cos function become almost equal to the zero transitions of the samples which are produced during the said cyclic sampling of the components a or, respectively, b. Thus, the desired cos function can be obtained by determining the zero transition and generating a corresponding square-wave signal and suitable filtering. It is now only necessary to convert the phase signal to the desired carrier frequency. Multiplication by the amplitude signal A(t) in the tube finally produces the desired ISB signal.

Thus, the following steps are carried out in the broadcast transmitter according to the invention:
addition and subtraction of the AF1 and AF2 signals,
Hilbert transformation of either the sum or the difference,
forming the amount for the amplitude signal,
cyclic sampling and null detection for the phase signal.

Mathematically, the following steps are executed:
In the text following, the symbol " " designates the operation of the Hilbert transformation.

The starting point is two sinusoidal signals:

$$AF1(t) = A\cos w_1 t \text{ and } AF2(t) = B\cos w_2 t$$

These are summed and, respectively, subtracted and the difference is subjected to a Hilbert transformation. The signals produced are sampled in such a manner that the Hilbert-transformed sum is multiplied by coswt and the difference is multiplied by sinwt (see FIGS. 5a, 5b).

$$y(t) = [AF1(t) + AF2(t)]\cos wt + [\widehat{AF2(t) - AF1(t)}]\sin wt$$

$$= [A\cos w_1 t + B\cos w_2 t]\cos wt + \widehat{[B\cos w_2 t - A\cos w_1 t]} - \sin wt$$
$$= [A\cos w_1 t + B\cos w_2 t]\cos wt + [B\sin w_2 t - A\sin w_1 t] - \sin wt$$
$$= [A\cos[(w + w_1)t] + B\cos[(w - w_2)t]$$

The AF1 signal thus forms the upper sideband $(w + w_1)$ and the AF2 signal forms the lower sideband $(w - w_2)$.

Following this explanation, the individual parts can now be easily identified in FIG. 2.

There are two input channels (7a and 7b) to which the two signals AF1 and AF2 are connected. The sum of the signals AF1 and AF2 is formed in the adder (16) and the difference is formed in the subtractor (17). The difference is phase shifted by 90° compared with the sum in the Hilbert transformer (12). Naturally, the Hilbert transformer can also be arranged to follow the adder instead of the subtractor. Sum a and the Hilbert-transformed difference b are supplied to the amplitude processor (22) which forms the amount of the two input signals and forwards them to the amplitude output (24). The sum a and the Hilbert-transformed difference b are inverted in the two inverters (19 and 20). The difference b and the Hilbert-transformed sum a and their respective inverses are connected to the inputs of the cyclic sampler (21). In the phase conditioner (23), the phase signal is calculated by null detection and clipping from the samples and output to the phase output (25). Amplitude output (24) and phase output (25) are connected to the direct-voltage-coupled amplifier (9) and, respectively, to the phase conditioner (10).

The actual construction of the Hilbert transformer, of the amplitude processor, of the phase conditioner and of the cyclic sampler will not be discussed in greater detail here since these are already known from the Patent Specifications mentioned initially.

Figure 3B:
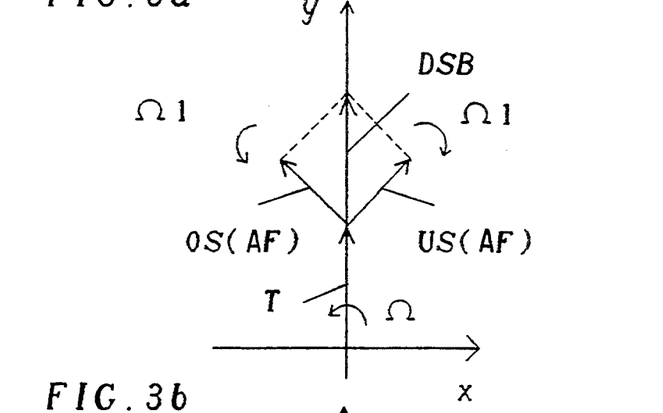
FIG. 3b shows a vector diagram of a DSB signal.
Figure 3C:
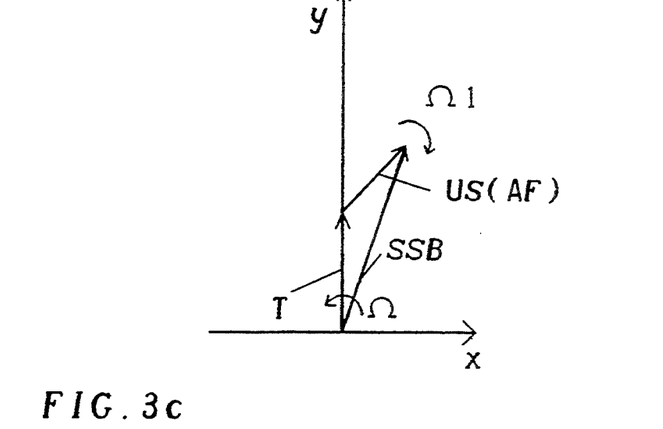
FIG. 3c shows a vector diagram of a SSB signal.

A comparison of FIGS. 3a–3c shows that a DSB signal can be interpreted as an ISB signal in which both AF signals are identical, and that a SSB signal is nothing else but an ISB signal with only one AF signal.

The signal conditioner (11) just presented can thus be used for all three types of modulation ISB, DSB and SSB by allocating the input channels (7a, b) to the AF signals as follows:
ISB: AF1(t)≠AF2(t)≠0
DSB: AF1(t)=AF2(t)=AF(t)
SSB: AF1(t)=AF(t) and AF2(t)=0
This can be implemented in a circuit by
a) connecting two different mutually independent signals AF1(t) and AF2(t) to the two input channels for ISB,
b) connecting the two input channels together and connecting only one signal for DSB,
c) connecting one input channel to ground and connecting an AF signal to the other one for SSB.

Hitherto, only signals without carriers have been discussed. Thus, the signals obtained were all such with suppressed carrier. Naturally, a carrier can also be added in the signal conditioner according to the invention.

Figure 4:
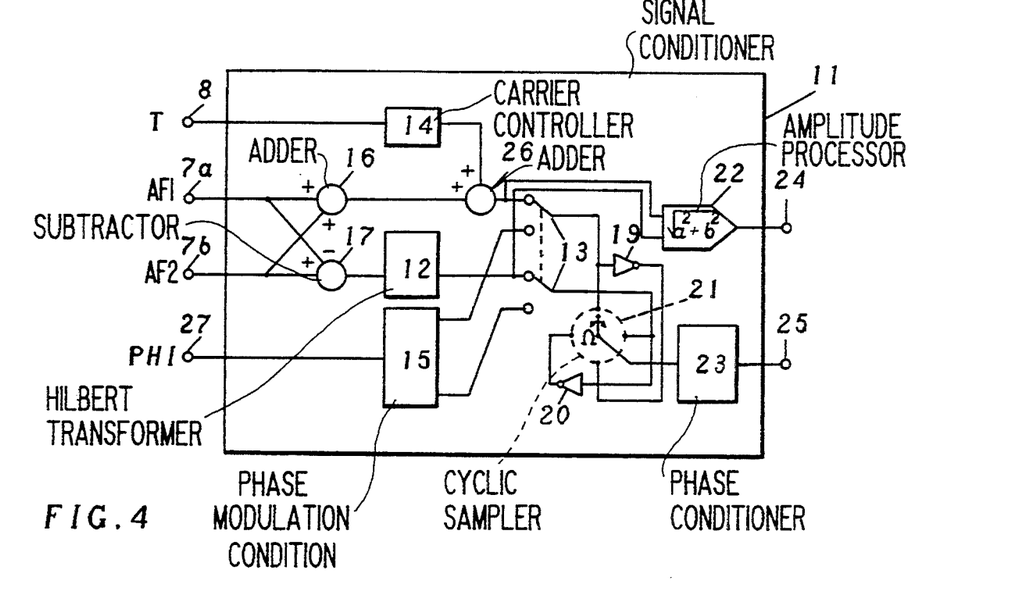
FIG. 4 shows a block diagram of a preferred embodiment of a signal conditioner according to the invention.

FIG. 4 shows the additional adder (26) which is interposed in the sum channel after the Hilbert transformation.

In the calculation following, the carrier is added to the two signals AF1(t) and AF2(t):

$$y(t) = [\overline{AF2(t) - AF1(t)}]\sin wt + \{T + [\overline{AF1(t) + AF2(t)}]\}\cos wt$$

$$= [Bcosw_2t - Acosw_1t]\sin wt + \{T + [Acosw_1t + Bcosw_2t]\}\cos wt$$
$$= [Bsinw_2t - Asinw_1t]\sin wt + \{T + [Acosw_1t + Bcosw_2t]\}\cos wt$$
$$= [T\cos wt + A\cos[(w+w_1)t] + B\cos[(w-w_2)t]$$

Adding a carrier is of great significance for the demodulation, on the one hand. On the other hand, however, this uses up a large proportion of the transmitter power for the carrier. To improve the proportion of signal power compared with carrier power, the carrier T can be controlled as a function of the modulation percentage in the broadcast transmitter according to the invention.

The carrier (T) is connected to the additional input (8). Controlling as determined by the carrier control characteristic or suppressing is carried out in the carrier controller (14). If the carrier is only lowered to such an extent that the carrier amplitude is always greater than the signal amplitude, this is called dynamic carrier control (DCC). If the carrier is lowered even further, the case can occur where the signal amplitude is greater than the carrier. Pictorially speaking, this folds the vector downward. In a sinusoidal signal, a phase shift of 180° occurs.

Figure 7:
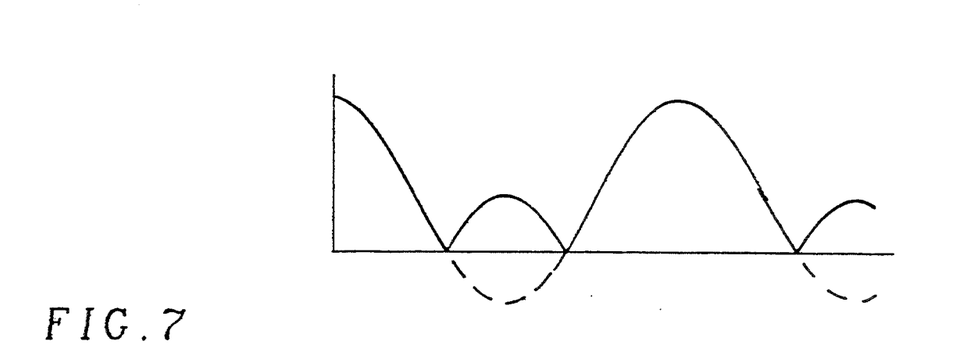
FIG. 7 shows the 180° phase shift which occurs if the signal amplitude becomes greater than the carrier amplitude.

FIG. 7 shows the effect of such a 180° phase shift on a sinusoidal signal.

This 180° phase shift additionally provides the signal with a phase-modulated component. This effect occurs both with signals without carrier and with signals in which the carrier amplitude is controlled, when the sum of the sideband vectors becomes greater than the carrier vector. Such additional phase modulation has hitherto been avoided if possible since the phase shift increases the distortion, on the one hand, and, on the other hand, the load of the transmitting tube rises.

In contrast to a double-sideband signal (DSB), a double-sideband signal with suppressed carrier (DSBSC) has the following form:

| DSB:   | $x_{DSB}(t) = A(t)^*\cos(w_0 t)$ | |
|---|---|---|
| where  | $A(t) = (T + m^*s_{AF}(t)) >= 0$ | Amplitude |
| DSBSC: | $x_{DSBSC}(t) = A(t)^*\cos(w_0 t + \Phi(t))$ | |
| where  | $A(t) = abs(T + m^*s_{AF}(t)) >= 0$ | Amplitude |
| and    | $\Phi(t) = (\pi/2)^*(1-\text{sign}(A(t)))$ | Phase |
|        | T = Carrier | |
|        | $S_{AF}$ = AF signal | |
|        | m = Signal amplitude/carrier amplitude (modulation percentage) | |

Seen mathematically, $x_{DSBSC}(t)$ therefore has the same form as the most general amplitude modulated signal, the ISB signal. Such a signal, both amplitude and phase modulated, can be processed in the same manner as an ISB signal in the signal conditioner (11) of the broadcast transmitter (1) according to the invention, by forming the amplitude signal in the amplitude processor (22) and the phase signal in the phase conditioner (23).

The amplitude signal A(t) corresponds to that of the DSB signal with carrier. The phase signal is obtained in the same manner as in the ISB signal by cyclically sampling the component sums, followed by null detection or clipping.

Thus, the broadcast transmitter according to the invention allows not only the transmission of ISB, SSB and DSB signals but also the transmission of such signals with suppressed or controlled carrier. In the case of DSB signals, the carrier may be lowered to such an extent that the signal amplitude becomes greater than the carrier amplitude since the additional phase modulation due to the 180° phase shift is carried out in the cyclic sampler. By suppressing or controlling the carrier, the utilization of the transmitting power can be considerably improved.

It is now a question of what happens to the cyclic sampler and the phase conditioner if the carrier is neither suppressed nor controlled, that is to say the DSB signal is purely amplitude modulated.

Figure 6:
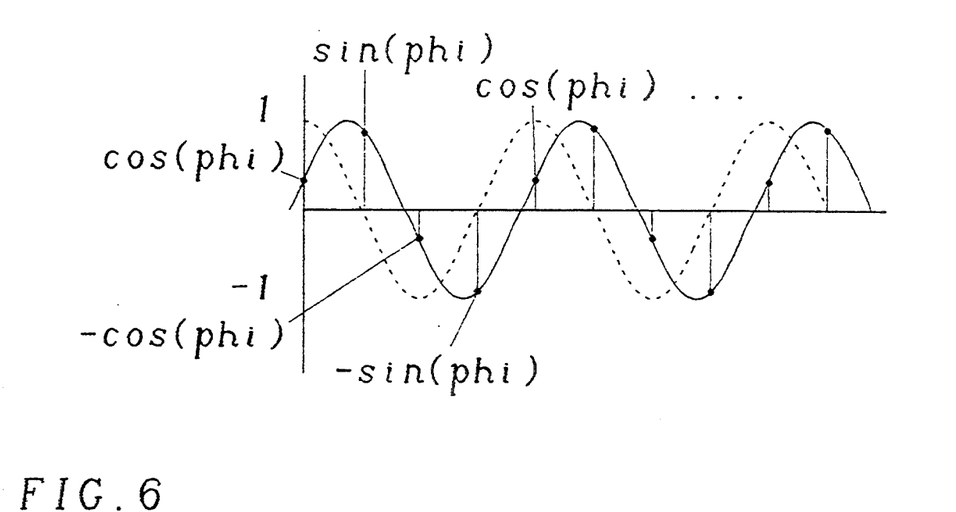
FIG. 6 shows the sampling of a cosinusoidal signal which has been shifted abruptly by an angle Φ (PSK)

Cyclic sampler and phase conditioner represent a device for phase modulating a carrier oscillation. This device can also be used in the case of DSB signals with full carrier as a possibility of transmitting an additional information item by means of arbitrary phase modulation of the carrier oscillation. It is conceivable, for example, to transmit a transmitter identification by means of phase shift keying (PSK) of the carrier oscillation. In the PSK method, an information item is transmitted by abruptly changing the phase of a carrier oscillation. It has been shown in conjunction with FIGS. 5a and 5b how a carrier frequency of Fs/4 can be generated in accordance with the principle of cyclic sampling: in the normal case, the sampling times are placed in such a manner that each second value is zero. In the standardized case, the samples then have the values 1, 0, −1, 0 etc. This sequence corresponds to a cosinusoidal oscillation of frequency Fs/4 sampled at Fs. This signal is now to be phase-shifted abruptly by an angle $\Phi$. FIG. 6 shows how the phase-shifted signal, drawn with a continuous line, is produced from the original signal drawn with a dashed line. Naturally, a phase-shifted carrier signal produces a different sequence of samples. The table below shows the sequences for a carrier oscillation with the phase angles 0°, $\Phi$ and $-\Phi$.

| $\Phi$ | Sampling sequence | | | | |
|---|---|---|---|---|---|
| 0° | 1 | 0 | −1 | 0 | etc. |
| $\Phi$ | $\cos\Phi$ | $\sin\Phi$ | $-\cos\Phi$ | $-\sin\Phi$ | etc. |
| $-\Phi$ | $\cos\Phi$ | $-\sin\Phi$ | $-\cos\Phi$ | $\sin\Phi$ | etc. |

Thus, the carrier oscillation can be subjected to any type of phase shift keying by selecting suitable sampling sequences. This makes it possible to transmit additional information.

In the signal conditioner (11) according to FIG. 4, the outputs of a phase modulation conditioner (15) can be connected together with the inputs of the cyclic sampler (21) instead of the outputs of the adder (26) and of the subtractor (17) by means of a changeover switch (13). The phase modulation conditioner (15) then handles the task of matching the phase-modulating signal (PHI), which is connected to the additional input (27), to the requirements of the cyclic sampler (21).

Overall, the invention results in a broadcast transmitter which, due to its special construction, has the following advantages:
possible use both for ISB, DSB and SSB signals,
simple setting of the type of modulation by allocating the signals to be transmitted to the input channels,
transmitting signals with controlled or suppressed carrier,
transmitting additional information by phase modulation of the carrier oscillation in DSB signals.

Obviously, numerous modifications and variations of the present invention are possible in the light of the above teachings. It is therefore to be understood that within the scope of the appended claims, the invention may be practiced otherwise than as specifically described herein.

| LIST OF DESIGNATIONS | |
| --- | --- |
| 1 | Broadcast transmitter |
| 2 | Signal input |
| 3 | Control grid |
| 4 | Anode |
| 5 | Transmitting tube |
| 6 | Antenna |
| 7a | Input channel 1 |
| 7b | Input channel 2 |
| 8 | Carrier input |
| 9 | Direct-voltage-coupled power amplifier |
| 10 | Phase conditioner |
| 11 | Signal conditioner |
| 12 | Hilbert transformer |
| 13 | Change-over switch |
| 14 | Carrier control |
| 15 | Phase modulation conditioner |
| 16 | Adder 1 |
| 17 | Subtractor |
| 19 | Inverter 1 |
| 20 | Inverter 2 |
| 21 | Cyclic sampler |
| 22 | Amplitude processor |
| 23 | Phase conditioner |
| 24 | Amplitude output |
| 25 | Phase output |
| 26 | Adder 2 |
| 27 | Phase modulation input |
| $\Omega$ | Sampling frequency |
| $\Omega 1$ | Frequency of the first AF signal |
| $\Omega 2$ | Frequency of the second AF signal |
| T | Carrier |
| AF | Audio-frequency signal |
| AF1 | AF signal 1 |
| AF2 | AF signal 2 |
| ISB | ISB vector |
| DSB | DSB vector |
| SSB | SSB vector |
| US | Upper sideband |
| LS | Lower sideband |
| Fs | Sampling frequency |
| PHI | Phase modulation signal |
| a | Hilbert-transformed sum |
| b | Difference |

What is claimed as new and desired to be secured by Letters Patent of the United States is:

1. An amplitude modulated broadcast transmitter (1) for providing various types of modulation, including DSB (double sideband), SSB (single sideband) and ISB (independent sideband), comprising:
   a) a signal input (2) for transmitting at least one audio frequency signal;
   b) a signal conditioner (11) having first and second input channels and two outputs, the input channels of the signal conditioner being connected to the signal input, and at a first output (24) of the signal conditioner an amplitude signal is output and at a second output (25) a phase signal is output;
   c) a direct-voltage-coupled power amplifier (9), arranged after the first output, for amplifying the amplitude signal;
   d) a phase conditioner (10), arranged after the second output, for processing the phase signal; and
   e) an output stage with a transmitting tube (5) which exhibits an anode (4) and at least one control grid (3), an output of the power amplifier being connected to the anode (4) and an output of the phase conditioner being connected to the at least one control grid (3);
wherein
   f) the signal conditioner (11) comprises
      aa) an adder (16) and a subtractor (17) which form a sum and a difference of the input channels (7a, 7b);
      bb) a Hilbert transformer (12), an input of which is connected to an output of the adder (16) and wherein said Hilbert transformer subjects the sum to a Hilbert transformation;
      cc) two inverters (19, 20) having inputs which are connected to outputs (a, b) of the subtractor (17) and the Hilbert transformer (12) respectively and wherein said two inverters (19, 20) invert a sign of signals present at their inputs;
      dd) a cyclic sampler (21) which cyclically samples outputs of the inverters (19, 20) and the outputs of the subtractor (17) and the Hilbert transformer (12) in a particular sequence;
      ee) a phase conditioner (23), an input of which is connected to an output of the cyclic sampler (21), an output of the phase conditioner of the signal conditioner (11) being connected to the second output (25) of the signal conditioner (11), and wherein said phase conditioner of the signal conditioner (11) generates a phase signal from the samples of the cyclic sampler;
      ff) an amplitude processor (22) which is connected with its two inputs to the outputs of the subtractor (17) and of the Hilbert transformer (12) for squaring the output signals (a, b) of the subtractor (17) and the Hilbert transformer (12), adding them, taking a square root of the summation of the squared input signals and outputting the square root of the summation as an output signal to its output which is connected to the first output (24) of the signal conditioner (11); and
   g) the type of modulation being determined by allocating a plurality of audio frequency signals (AF1, AF2) to be transmitted in a particular manner to the two input channels (7a, 7b) of the signal conditioner.

2. Broadcast transmitter as claimed in claim 1, wherein
   a) two manually independent AF signals (AF1, AF2) are connected to the two input channels (7a, 7b) for ISB;
   b) two equal AF signals are connected to the two input channels (7a, 7b) for DSB; and
   c) an AF signal is connected to only the first input channel (e.g., 7a) whilst the second input channel (corresponding to 7b) is connected to ground for SSB.

3. Broadcast transmitter as claimed in claim 2, wherein the signals which are input to the cyclic sampler (21) are sampled in alternating sequences.

4. Broadcast transmitter as claimed in claim 1, wherein the direct-voltage-coupled power amplifier (9) comprises a PSM amplifier.

5. Broadcast transmitter as claimed in claim 1, wherein the phase conditioner (23) of the signal conditioner (11) generates a phase signal either by clipping or by null detection from the samples of the cyclic sampler (21).

6. Broadcast transmitter as claimed in claim 1, wherein the phase conditioner (10) essentially comprises a frequency converter.

7. An amplitude modulated broadcast transmitter for providing various types of modulation, including DSB (double sideband), SSB (single sideband) and ISB (independent sideband), comprising:
   a) a signal input for transmitting at least one audio frequency signal;
   b) a signal conditioner having first and second input channels and two outputs, the input channels of the signal conditioner being connected to the signal input, and at a first output of the signal conditioner an amplitude signal is output and at a second output a phase signal is output;
   c) a direct-voltage-coupled power amplifier, arranged after the first output, for amplifying the amplitude signal;
   d) a phase conditioner, arranged after the second output, for processing the phase signal; and
   e) an output stage with a transmitting tube which exhibits an anode and at least one control grid, an output of the power amplifier being connected to the anode and an output of the phase conditioner being connected to the at least one control grid;
   wherein
   f) the signal conditioner comprises
      aa) an adder and a subtractor which form a sum and a difference of the input channels;
      bb) a Hilbert transformer, an input of which is connected to an output of the subtractor and wherein said Hilbert transformer subjects the difference to a Hilbert transformation;
      cc) two inverters having inputs which are connected to outputs of the adder and the Hilbert transformer and wherein said two inverters invert a sign of signals present at their inputs;
      dd) a cyclic sampler which cyclically samples outputs of the inverters and outputs of the adder and the Hilbert transformer in a particular sequence;
      ee) a phase conditioner, an input of which is connected to an output of the cyclic sampler, an output of the phase conditioner of the signal conditioner being connected to the second output, and wherein said phase conditioner of the signal conditioner generates a phase signal from the samples of the cyclic sampler;
      ff) an amplitude processor which is connected with its two inputs to the outputs of the adder and the Hilbert transformer for squaring the output signals of the adder and the Hilbert transformer, adding them and then taking a square root of the summation of the squared input signals and outputting the square root of the summation as an output signal to its output which is connected to the first output of the signal conditioner; and
   g) the type of modulation being determined by allocating a plurality of audio frequency signals to be transmitted in a particular manner to the two input channels of the signal conditioner.

8. Broadcast transmitter as claimed in claim 7, wherein the signal conditioner (11) additionally comprises
   a) a carrier input (T),
   b) a second adder (26), a first input of which is connected to the output of the adder (16) and an output of which is connected to inputs of the cyclic sampler (21) and the amplitude processor (22), and
   c) a carrier controller, an input of which is connected to the carrier input (T) and an output of which is connected to a second input of the second adder (26),
   d) the carrier input (T) being added by means of the second adder (26) following the adder (16).

9. Broadcast transmitter as claimed in claim 8, wherein the added carrier input (T) is controlled as a function of a modulation percentage as determined by a carrier control characteristic in the carrier controller (14).

10. Broadcast transmitter as claimed in claim 7, wherein the signal conditioner (11) additionally comprises
   a) a four-terminal change-over switch (13), two inputs always being coupled to form one input pair, and the first input pair being connected to the output of the Hilbert transformer (12) and an output of the adder (16), and outputs of the switch being connected to the inputs of the cyclic sampler (21);
   b) a third channel (27) for a further signal (PHI);
   c) a phase modulation conditioner (15), an input of which is connected to the third input channel (27) and outputs of which are connected to the second input pair of the change-over switch (13).

11. Broadcast transmitter as claimed in claim 10, wherein, in DSB, if an amplitude of said at least one audio frequency signal is always smaller than an amplitude of the carrier, for the purpose of transmitting additional information,
   a) the change-over switch (13) is switched in such a manner that the outputs of the phase modulation conditioner (15) are switched through to the cyclic sampler and
   b) a phase signal produced in the cyclic sampler is phase modulated by the phase modulation conditioner.

12. Broadcast transmitter as claimed in claim 11, wherein signals input to the cyclic sampler, to generate an abrupt phase shift of a phase-shift-keyed signal by an angle $\Phi$, are sampled at the times t1, t2, t3, t4 at which the samples are
   $\cos\Phi$ at t1,
   $\sin\Phi$ at t2,
   $-\cos\Phi$ at t3,
   $-\sin\Phi$ at t4.

* * * * *